United States Patent
Kim

(10) Patent No.: US 9,262,291 B2
(45) Date of Patent: Feb. 16, 2016

(54) TEST DEVICE AND OPERATING METHOD THEREOF

(71) Applicant: SK hynix Inc., Gyeonggi-do (KR)

(72) Inventor: Jin-Wook Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/509,884

(22) Filed: Oct. 8, 2014

(65) Prior Publication Data

US 2015/0293825 A1 Oct. 15, 2015

(30) Foreign Application Priority Data

Apr. 10, 2014 (KR) .................. 10-2014-0043162

(51) Int. Cl.
*G06F 17/50* (2006.01)
*G06F 11/26* (2006.01)

(52) U.S. Cl.
CPC .................................. *G06F 11/261* (2013.01)

(58) Field of Classification Search
CPC .................... G06F 17/5031; G06F 17/5072
USPC .......................................................... 716/136
See application file for complete search history.

(56) References Cited

U.S. PATENT DOCUMENTS

| | | | | |
|---|---|---|---|---|
| 4,806,852 | A * | 2/1989 | Swan et al. | 324/73.1 |
| 6,341,094 | B1 * | 1/2002 | Auracher | 365/201 |
| 6,466,520 | B1 * | 10/2002 | Speyer et al. | 368/118 |
| 7,460,984 | B1 * | 12/2008 | Clark et al. | 703/2 |
| 7,653,849 | B1 * | 1/2010 | Tabatabaei | 714/726 |
| 8,531,196 | B1 * | 9/2013 | Shelat et al. | 324/750.3 |
| 2003/0196182 | A1 * | 10/2003 | Hahn | 716/6 |
| 2004/0044509 | A1 * | 3/2004 | Demler et al. | 703/14 |
| 2006/0038582 | A1 * | 2/2006 | Peeters | 326/16 |
| 2008/0012576 | A1 * | 1/2008 | Sato et al. | 324/617 |
| 2008/0120585 | A1 * | 5/2008 | Nozuyama et al. | 716/6 |
| 2009/0055784 | A1 * | 2/2009 | Izumi et al. | 716/5 |
| 2009/0138837 | A1 * | 5/2009 | Baumgartner et al. | 716/6 |
| 2011/0068820 | A1 * | 3/2011 | Fox | 326/16 |
| 2013/0185683 | A1 * | 7/2013 | Lee et al. | 716/103 |
| 2013/0260485 | A1 * | 10/2013 | van der Wagt et al. | 438/17 |

FOREIGN PATENT DOCUMENTS

KR 1020050102507 10/2005

* cited by examiner

*Primary Examiner* — Suchin Parihar
(74) *Attorney, Agent, or Firm* — IP & T Group LLP

(57) ABSTRACT

A test device includes a circuit modelling portion suitable for generating one or more model circuits by modelling a test-object circuit with a one-to-one or a one-to-multi relationship between the test-object circuit and the model circuits, and a test operation portion suitable for synthesizing the model circuits and performing a test operation on the model circuits.

19 Claims, 5 Drawing Sheets

FIG. 6

| | | | | | | | | | | | | | | | | | | | | | | | | | | | | |
|---|---|---|---|---|---|---|---|---|---|---|---|---|---|---|---|---|---|---|---|---|---|---|---|---|---|---|---|---|
| II | | | | | | | | | | | | | | | | | | | | | | | | | | | | |
| OO | | | | | | | | | | | | | | | | | | | | | | | | | | | | |
| CNT | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 |
| LAT1 | 0 | 42 | 42 | 42 | 42 | 42 | 42 | 42 | 42 | 42 | 42 | 42 | 42 | 42 | 42 | 42 | 42 | 42 | 42 | 42 | 42 | 42 | 42 | 42 | 42 | 0 | 0 | 0 |
| CMP1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| LAT2 | 0 | 0 | 0 | 45 | 45 | 45 | 45 | 45 | 45 | 45 | 45 | 45 | 45 | 45 | 45 | 45 | 45 | 45 | 45 | 45 | 45 | 45 | 45 | 45 | 45 | 45 | 45 | 0 |
| CMP2 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 1 | 0 |

TEST DEVICE AND OPERATING METHOD THEREOF

CROSS-REFERENCE TO RELATED APPLICATIONS

The present application claims priority of Korean Patent Application NO. 10-2014-0043162, filed on Apr. 10, 2014, which is incorporated herein by reference in its entirety.

BACKGROUND

1. Field

Exemplary embodiments of the present invention relate to a semiconductor design technology, and more particularly, to a test device for testing a test-object circuit.

2. Description of the Related Art

Semiconductor devices such as Double Data Rate Synchronous Dynamic Random Access Memory (DDR SDRAM) need to be tested in various ways before being put on the market. Such circuits may be tested on a Field Programmable Gate Array (FPGA). A FPGA is advantageous because it is capable of being quickly designed, has low implementation cost, and has design flexibility. Therefore, it is frequently used for testing integrated circuits. However, it is difficult to test fully customized circuits, designed from a transistor level, on an FPGA.

The process of designing the test-object circuit and synthesizing the test-object circuit on the FPGA will be described.

After the test-object circuit is designed through a schematic tool, the schematic tool generates a netlist corresponding to the test-object circuit. A netlist is a file generated by a schematic tool for simulation or for Layout Versus Schematic (LVS) automation. The netlist contains information on the synthesized circuit including interconnection relationships and nodes of the synthesized circuit, which are identifiable using the FPGA. The FPGA applies the netlist and performs test operations on the synthesized circuit. However, in custom-designed circuits that have a lot of asynchronous elements, logic simulation may be performed but it is difficult to evaluate such a circuit on an FPGA.

SUMMARY

Various embodiments of the present invention are directed to a test device capable of modelling a test-object circuit of various types, synthesizing a model circuit of various types, and testing the synthesized circuit.

In accordance with an embodiment of the present invention, A test device includes a circuit modelling portion suitable for generating one or more model circuits by modelling a test-object circuit with a one-to-one or a one-to-multi relationship between the test-object circuit and the model circuits; and a test operation portion suitable for synthesizing the model circuits and performing a test operation on the model circuits.

The circuit modelling portion may model the test-object circuit with the one-to-multi relationship to generate the model circuits of different types based on a delay amount of the test-object circuit.

In accordance with an embodiment of the present invention, a method of operating a test device includes modelling a first test-object circuit of test-object circuits with a one-to-one relationship to generate a first model circuit; modelling a second test-object circuit of the test-object circuits with a one-to-multi relationship to generate a second model circuit; and performing a test operation by synthesizing the first and second model circuits.

The modelling of the second test-object circuit may include determining a circuit type of the second model circuit based on a delay amount of the second test-object circuit.

The modelling of the second test-object circuit may include generating the second model circuit of a first type when the delay amount less than a predetermined delay amount; and generating the second model circuit of a second type when the delay amount is greater than or equal to the predetermined delay amount.

A circuit area of the first-typed second model circuit may be proportional to the delay amount.

The first-typed second model circuit may perform a shifting operation during a period corresponding to the delay amount.

A circuit area of the second-typed second model circuit may be substantially constant regardless of the delay amount.

The second-typed second model circuit may perform a counting operation a number of times corresponding to the delay amount.

The first-typed and second-typed second model circuits may be synchronous circuits.

In accordance with an embodiment of the present invention, a test device includes a circuit modelling portion suitable for generating various types of model circuits based on a delay amount of a test-object circuit; and a test operation portion suitable for synthesizing the model circuits and performing a test operation on the model circuits.

The model circuits may include a first-typed model circuit generated when the delay amount is under a predetermined delay amount, and a second-typed model circuit when the delay amount is greater than or equal to the predetermined delay amount.

A circuit area of the first-typed model circuit may be proportional to the delay amount.

The first-typed model circuit may include a shifting circuit suitable for shifting an input signal during a period corresponding to the delay amount.

A circuit area of the second-typed model circuit may be substantially constant regardless of the delay amount.

The second-typed model circuit may include a counting unit suitable for counting in response to an input signal; and a comparison unit suitable for comparing the delay amount with an output signal of the counting unit and outputting a result of the comparison.

The second-typed model circuit may include a first latching unit suitable for latching a time corresponding to the delay amount in response to a rising edge of an input signal; a second latching unit suitable for latching the time corresponding to the delay amount in response to a falling edge of the input signal; a counting unit suitable for performing a counting operation in response to a clock signal; a first comparison unit suitable for comparing output signals of the first latching unit and the counting unit; a second comparison unit suitable for comparing output signals of the second latching unit and the counting unit; and an output unit suitable for generating an output signal in response to output signals of the first and second comparison units.

The second-typed model circuit may further include an addition unit suitable for providing the first and second latching units with a sum of the output signal of the counting unit and the delay amount.

The first-typed and second-typed model circuits may be synchronous circuits.

In accordance with an embodiment of the present invention, a method of operating a test device includes generating a first netlist in response to a first delay amount; generating a second netlist in response to a second delay amount, which is greater than the first delay amount; and testing the first and second netlists, wherein the first and second netlists are different model circuits than each other.

The method of operating the test device may include loading a delay circuit of test-object circuits; and determining whether a delay amount of a loaded delay circuit is the first delay amount or the second delay amount.

The model circuits corresponding to the first and second netlists may be synchronous circuits.

The testing of the first and second netlists may include synthesizing the first and second netlists in the test device to generate a synthesized circuit; and testing the synthesized circuit.

In accordance with the embodiments of the present invention, the test device may model a test-object circuit of various types, synthesize a model circuit of various types, and test the synthesized circuit.

In accordance with the embodiments of the present invention, the test device may minimize time and space required for synthesizing the model circuit by selecting a desired type of model circuit based on a situation in synthesizing the test-object circuit.

BRIEF DESCRIPTION OF THE DRAWINGS

FIG. 6 is a timing diagram illustrating an operation of the second-typed delay circuit shown in FIG. 5.

DETAILED DESCRIPTION

Figure 1:
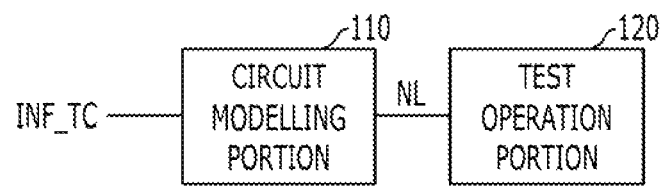
FIG. 1 is a block diagram illustrating a test device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, like reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a block diagram illustrating a test device in accordance with an embodiment of the present invention.

Referring to FIG. 1, the test device may include a circuit modelling portion 110 and a test operation portion 120.

The circuit modelling portion 110 may generate various types of model circuits in response to information INF_TC corresponding to a test-object circuit. The information INF_TC corresponding to a test-object circuit is referred to as test circuit information. The test circuit information INF_TC may include substantial physical information of the test-object circuit, or a code corresponding to the test-object circuit. An output signal NL of the circuit modelling portion 110 may also include substantial physical information of a model circuit of the test-object circuit, or a code corresponding to the model circuit of the test-object circuit. The output signal NL of the circuit modelling portion 110 may correspond to netlist information of the model circuit of the test-object circuit. The test operation portion 120 may perform a test operation by synthesizing the model circuit of the test-object circuit included in the output signal NL of the circuit modelling portion 110.

In accordance with the embodiments of the present invention, the test device may model all of test-object circuits including an asynchronous circuit as synchronous circuits, and synthesize model circuits (i.e., the synchronous circuits). A one-to-one or one-to-multi relationship may be applied to a modelling relationship of the test device. The one-to-one or one-to-multi relationship, which represents the modelling relationship, will be described with reference to FIG. 2.

Figure 2:
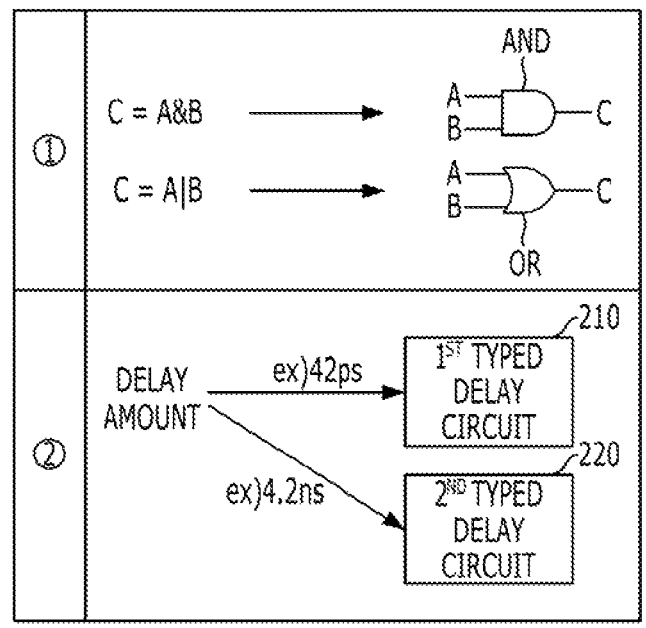
FIG. 2 is a table illustrating a modelling relationship in accordance with an embodiment of the present invention.

FIG. 2 is a table illustrating a modelling relationship in accordance with an embodiment of the present invention.

For clear description, FIG. 2 shows cases ① and ②, which are a one-to-one modelling relationship case and a one-to-multi modelling relationship case, respectively.

Referring to FIG. 2, case ①, which is the one-to-one modelling relationship case, an AND gate is an exemplary model circuit of a test-object circuit of 'C=A&B', and an OR gate is an exemplary model circuit of a test-object circuit of 'C=A|B'. That is, case ① may represent the one-to-one relationship between the test-object circuit and the model circuit.

As to case ②, which is the one-to-multi modelling relationship case, a delay amount of a test-object circuit is a test-object for the one-to-multi modelling relationship. One of two kinds of delay circuits, that is, a first-typed delay circuit 210 and a second-typed delay circuit 220, is an exemplary model circuit for the delay amount. That is, one of the first-typed delay circuit 210 and the second-typed delay circuit 220 may selectively be a model circuit of a test-object circuit depending on the delay time, which means that the test-object circuit and the model circuits may have the one-to-multi modelling relationship. The delay amount of the test-object circuit may include synchronous and/or asynchronous delay amounts of the test-object circuit. Case ② of FIG. 2 exemplarily shows the delay amount of 42 ps and 4.2 ns. Also, the test-object circuit having the delay amount of 42 ps, which is relatively short, is exemplarily modelled into the first-typed delay circuit 210, and the test-object circuit having the delay amount of 4.2 ns, which is relatively long, is exemplarily modelled into the second-typed delay circuit 220. The first and second-typed delay circuits 210 and 220 will be described in detail with reference to FIGS. 3 and 4.

In accordance with an embodiment of the present invention, the test device may selectively adopt one of the one-to-one modelling relationship and one-to-multi modelling relationships depending on the test-object circuit.

Referring back to FIGS. 1 and 2, the circuit modelling portion 110 may generate the output signal NL of the circuit modelling portion 110 in response to the test circuit information INF_TC. The test circuit information INF_TC may be the delay amount of the test-object circuit, which means that the circuit modelling portion 110 may selectively model the delay amount of the test-object circuit with one of the first-typed delay circuit 210 and the second-typed delay circuit 220 depending on the amount of delay time.

In accordance with an embodiment of the present invention, the test device may select the type of the model circuit of the test-object circuit, depending on the delay amount of the test-object circuit.

Figure 3:
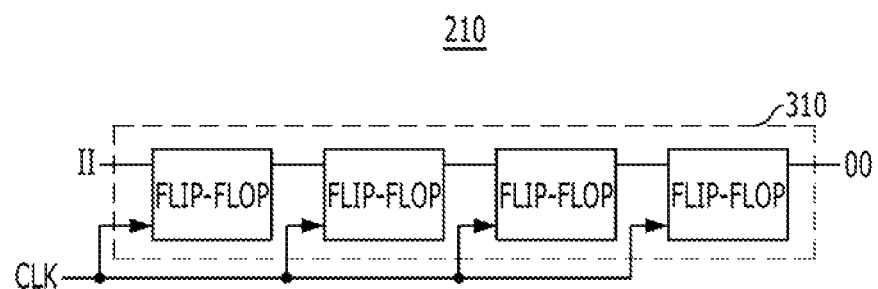
FIGS. 3 and 4 are block diagrams illustrating first and second-typed delay circuits shown in FIG. 2, respectively.
Figure 4:
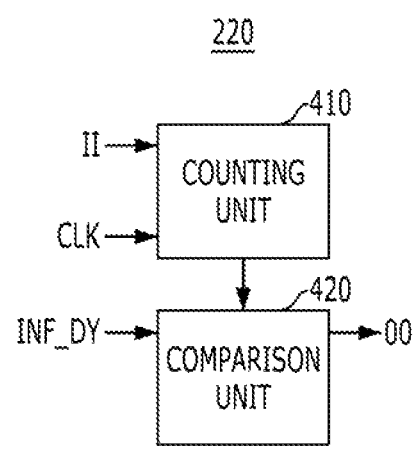

FIGS. 3 and 4 are block diagrams illustrating the first and second-typed delay circuits 210 and 220 shown in FIG. 2, respectively.

FIG. 3 shows the first-typed delay circuit 210.

Referring to FIG. 3, the first-typed delay circuit 210 may include a shifting part 310 suitable for outputting an input signal II as an output signal OO through a shifting operation in response to a clock signal CLK. The shifting part 310 may include a plurality of flip-flops. FIG. 3 exemplarily shows the shifting part 310 including four flip-flops.

A test operation frequency of the test operation portion 120 shown in FIG. 1 may be lower than an actual operation frequency of the test-object circuit, which means that the test operation portion 120 may test logical operation of the test-object circuit regardless of test time when the test device tests the test-object circuit. For example, a model circuit of the test-object circuit having the delay amount of 42 ps may be tested by the test operation portion 120 even though the model circuit operates slower than the operating speed corresponding to the delay amount of 42 ps, under the condition that a logically consistent result of the test may be obtained.

Referring back to FIG. 3, when the period of the clock signal is 42 ps, the input signal II may be shifted in response to the clock signal CLK and the output signal OO may be outputted after 168 ps. As such, the test-object circuit having the delay amount of 42 ps may be modelled with the four flip-flops. A test-object circuit having a delay amount greater than 42 ps may be modelled with an addition of flip-flops.

On the other hand, when a test-object circuit having a delay amount of 4.2 ns is modelled with a plurality of flip-flops as shown in FIG. 3, the test-object circuit needs to be modelled with 400 flip-flops. In accordance with an embodiment of the present invention, the test device may model the test-object circuit having a greater delay amount, such as 4.2 ns, with the second-typed delay circuit 220 shown in FIG. 4.

Referring to FIG. 4, the second-typed delay circuit 220 may include a counting unit 410 and a comparison unit 420. The counting unit 410 may perform a counting operation in response to an input signal II. The comparison unit 420 may generate an output signal OO by comparing the delay amount information INF_DY with an output signal of the counting unit 410. The delay amount information INF_DY means a delay amount to be reflected to the test-object circuit in the test operation portion 120 described with reference to FIG. 1.

Operation of the second-typed delay circuit 220 will now be described.

When the input signal II is activated, the counting unit 410 may perform the counting operation in response to the clock signal CLK. The comparison unit 420 may compare the delay amount information INF_DY with the output signal of the counting unit 410, and activate the output signal OO when the delay amount information INF_DY and the output signal of the counting unit 410 become identical. Therefore, the second-typed delay circuit 220 may perform the counting operation a number of times corresponding to the delay amount information INF_DY (i.e., the delay amount) after activation of the input signal II, and output the output signal OO, which is identical to the input signal II.

When the delay amount information INF_DY represents 4.2 ns, the test-object circuit having the delay amount of 4.2 ns may be modelled with the counting unit 410 and the comparison unit 420. The second-typed delay circuit 220 including the counting unit 410 and the comparison unit 420 may not further include additional circuits even though the delay amount of the test-object circuit becomes greater than 4.2 ns.

Figure 5:
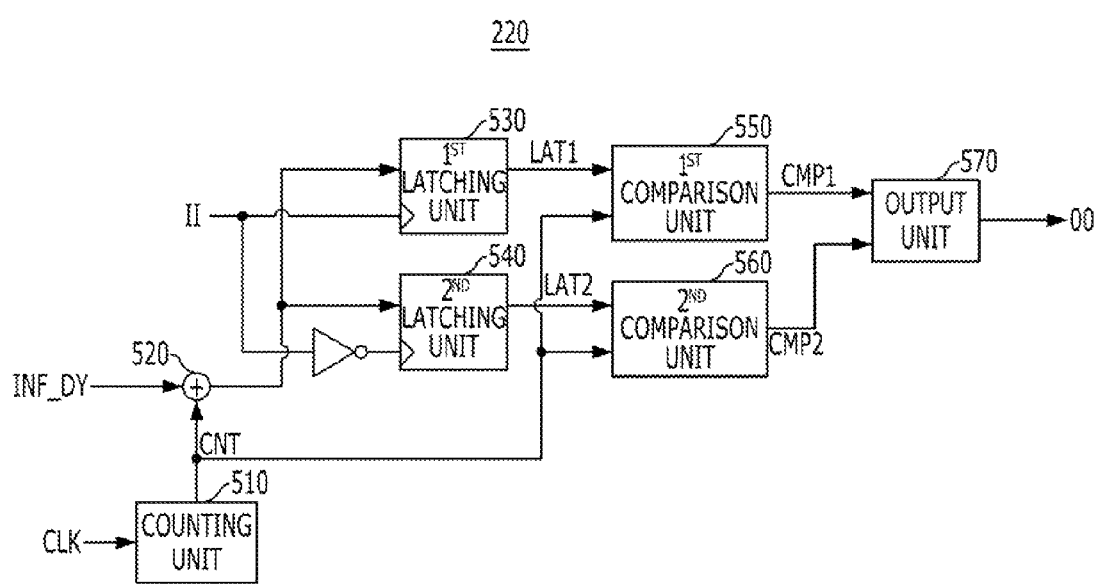
FIG. 5 is a block diagram illustrating another example of a second-typed delay circuit shown in FIG. 2.

FIG. 5 is a block diagram illustrating another example of the second-typed delay circuit 220 shown in FIG. 2.

Referring to FIG. 5, the second-typed delay circuit 220 may include a counting unit 510, an addition unit 520, first and second latching units 530 and 540, first and second comparison units 550 and 560, and an output unit 570.

The counting unit 510 may perform a counting operation in response to the clock signal CLK. A counting value CNT, which is an output signal of the counting unit 510, may represent the current time, which will be described in detail when the operation of the second-typed delay circuit 220 is described with reference to FIG. 6. The addition unit 520 may add the delay amount information INF_DY to the counting value CNT, and provide the result of the addition to the first and second latching units 530 and 540. The first and second latching units 530 and 540 may latch an output signal of the addition unit 520 in response to the input signal II. The first latching unit 530 may latch the output signal of the addition unit 520 in response to a rising edge of the input signal II, which means that the first latching unit 530 may latch the sum of the current time corresponding to the rising edge of the input signal II and the amount of time corresponding to the delay amount information INF_DY. The second latching unit 540 may latch the output signal of the addition unit 520 in response to a falling edge of the input signal II, which means that the second latching unit 540 may latch the sum of the current time corresponding to the falling edge of the input signal II and the amount of time corresponding to the delay amount information INF_DY.

The first comparison unit 550 may compare the counting value CNT with a first latching value LAT1, which is the output signal of the first latching unit 530, and detect a time point when the counting value CNT and the first latching value LAT1 are the same as each other. The second comparison unit 560 may compare the counting value CNT with a second latching value LAT2, which is the output signal of the second latching unit 540, and detect a time point when the counting value CNT and the second latching value LAT2 are the same as each other. The output unit 570 may generate the output signal OO in response to first and second comparison signals CMP1 and CMP2, which are output signals of the first and second comparison units 550 and 560, respectively.

FIG. 6 is a timing diagram illustrating an operation of the second-typed delay circuit 220 shown in FIG. 5.

FIG. 6 shows the input signal II, the output signal OO, the counting value CNT, the first and second latching values LAT1 and LAT2, and the first and second comparison signals CMP1 and CMP2. As an example, the delay amount information INF_DY is 22.

Referring to FIGS. 5 and 6, the counting value CNT may increase based on the current time. When the input signal II transitions from a logic LOW to a logic HIGH, the first latching unit 530 may latch a value of 42, which is sum of 20 and 22 respectively representing the current time and the delay amount information INF_DY, in response to the rising edge of the input signal II. When the input signal II transitions from the logic HIGH to the logic LOW, the second latching unit 540 may latch a value of 45 in response to the falling edge of the input signal II. The first comparison unit 550 may generate the first comparison signal CMP1 by comparing the first latching value LAT1 with the counting value CNT. The second comparison unit 560 may generate the second comparison signal CMP2 by comparing the second latching value LAT2 with the counting value CNT. The output unit 570 may generate the output signal OO in response to the first and second comparison signals CMP1 and CMP2. The output signal OO may transition from the logic LOW to the logic HIGH when the first comparison signal CMP1 is '1', and from the logic HIGH to the logic LOW when the second comparison signal CMP2 is '1'.

As described with reference to FIGS. 3 to 5, in accordance with an embodiment of the present invention, the test device may model the test-object circuit in various types of model circuits based on the delay amount of the test-object circuit, and the model circuits may be synchronous circuits synchronized to the clock signal CLK. The synchronous circuits may not be restricted by the test operation frequency, which means that the test operation frequency may be set to be high during the test operation of the synchronous circuits, and that the test operation may be swiftly performed.

Figure 7:
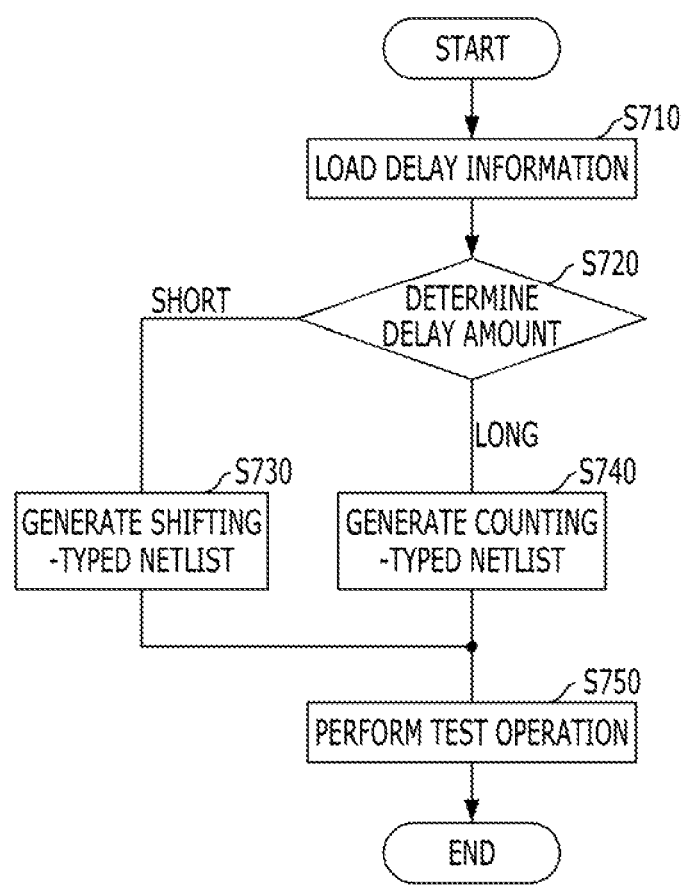
FIG. 7 is a flow chart illustrating an operation of a test device in accordance with an embodiment of the present invention.

FIG. 7 is a flow chart illustrating an operation of a test device in accordance with an embodiment of the present invention.

Referring to FIG. 7, the operation of the test device may include the steps of loading delay information (S710), determining delay amount (S720), generating a shifting-typed netlist (S730), generating a counting-typed netlist (S740), and performing a test operation (S750).

At step S710, the delay information of the test-object circuit may be loaded. The delay information may mean the delay amount of the test-object circuit. At step S720, which is the step of determining the delay amount of the test-object circuit, the operation of the test device may branch to step S730 when the delay amount of the test-object circuit is less than a predetermined delay amount ('SHORT'), or to step S740 when the delay amount of the test-object circuit is greater than the predetermined delay amount ('LONG'). At step S730, a shifting-typed netlist may be generated. The shifting-typed netlist may include a circuit, the circuit area of which becomes different depending on the delay amount as described with reference to FIG. 3. At step S740, the counting-typed netlist may be generated. The counting-typed netlist may include a circuit, the circuit area of which keeps unchanged regardless of the delay amount as described with reference to FIG. 4.

At step S750, the test operation may be performed using the netlist generated at step S730 or S740.

In accordance with an embodiment of the present invention, the test device may generate various types of the netlists depending on the delay amount of the test-object circuit, and perform the test operation on the test-object circuit using the netlists generated as such.

As described above, in accordance with an embodiment of the present invention, the test device may model all elements of the test-object circuit as a synchronous circuit synchronized to the clock signal CLK. Particularly, in case of synthesis on the delay amount, the test-object circuit may be modelled in various types, that is, the one-to-multi relationship. Also, the model circuit corresponding to a large delay amount may keep the circuit area unchanged to reduce required time for synthesis operation thereon.

While the present invention has been described with respect to the specific embodiments, it will be apparent to those skilled in the art that various changes and modifications may be made without departing from the spirit and scope of the invention as defined in the following claims.

What is claimed is:

1. A test device comprising:
   a circuit modelling portion suitable for generating one or more model circuits by modelling a test-object circuit in a one-to-one ratio relationship between the test-object circuit and the model circuits or in a one-to-multi ratio relationship between the test-object circuit and the model circuits; and
   a test operation portion suitable for synthesizing the model circuits and performing a test operation on the model circuits,
   wherein the circuit modelling portion models the test-object circuit with the one-to-multi relationship to generate the model circuits of different types based on a delay amount of the test-object circuit.

2. A method of operating a test device comprising:
   at a circuit modelling portion, modelling a first test-object circuit of test-object circuits in a one-to-one ratio relationship between the first test-object circuit and a first model circuit to generate the first model circuit;
   at the circuit modeling portion, modelling a second test-object circuit of the test-object circuits in a one-to-multi ratio relationship between the second test-object circuit and a second model circuit to generate the second model circuit; and
   at a test operation circuit, performing a test operation by synthesizing the first and second model circuits,
   wherein the modelling of the second test-object circuit comprises:
   determining a circuit type of the second model circuit based on a delay amount of the second test-object circuit.

3. The method of claim 2, wherein the modelling of the second test-object circuit comprises:
   generating the second model circuit of a first type when the delay amount less than a predetermined delay amount; and
   generating the second model circuit of a second type when the delay amount is greater than or equal to the predetermined delay amount.

4. The method of claim 3, wherein a circuit area of the first-typed second model circuit is proportional to the delay amount.

5. The method of claim 3, wherein the first-typed second model circuit performs a shifting operation during a period corresponding to the delay amount.

6. The method of claim 3, wherein a circuit area of the second-typed second model circuit is substantially constant regardless of the delay amount.

7. The method of claim 3, wherein the second-typed second model circuit performs a counting operation a number of times corresponding to the delay amount.

8. The method of claim 3, wherein the first-typed and second-typed second model circuits are synchronous circuits.

9. A test device comprising:
- a circuit modelling portion suitable for generating various types of model circuits based on a delay amount of a test-object circuit; and
- a test operation portion suitable for synthesizing the model circuits and performing a test operation on the model circuits,
- wherein the model circuits include a first-typed model circuit generated when the delay amount is under a predetermined delay amount, and a second-typed model circuit when the delay amount is greater than or equal to the predetermined delay amount.

10. The test device of claim 9, wherein a circuit area of the first-typed model circuit is proportional to the delay amount.

11. The test device of claim 9, wherein the first-typed model circuit includes a shifting circuit suitable for shifting an input signal during a period corresponding to the delay amount.

12. The test device of claim 9, wherein a circuit area of the second-typed model circuit is substantially constant regardless of the delay amount.

13. The test device of claim 9, wherein the second-typed model circuit includes:
- a counting unit suitable for counting in response to an input signal; and
- a comparison unit suitable for comparing the delay amount with an output signal of the counting unit and outputting a result of the comparison.

14. The test device of claim 9, wherein the second-typed model circuit includes:
- a first latching unit suitable for latching a time corresponding to the delay amount in response to a rising edge of an input signal;
- a second latching unit suitable for latching the time corresponding to the delay amount in response to a falling edge of the input signal;
- a counting unit suitable for performing a counting operation in response to a clock signal;
- a first comparison unit suitable for comparing output signals of the first latching unit and the counting unit;
- a second comparison unit suitable for comparing output signals of the second latching unit and the counting unit; and
- an output unit suitable for generating an output signal in response to output signals of the first and second comparison units.

15. The test device of claim 14, wherein the second-typed model circuit further includes an addition unit suitable for providing the first and second latching units with a sum of the output signal of the counting unit and the delay amount.

16. The test device of claim 9, wherein the first-typed and second-typed model circuits are synchronous circuits.

17. A method of operating a test device comprising:
- at a circuit modelling portion, generating a first netlist in response to a first delay amount;
- at the circuit modelling portion, generating a second netlist in response to a second delay amount, which is greater than the first delay amount;
- at a test operation circuit, testing the first and second netlists;
- loading a delay circuit of test-object circuits; and
- determining whether a delay amount of a loaded delay circuit is the first delay amount or the second delay amount,
- wherein the first and second netlists are different model circuits than each other.

18. The method of claim 17, wherein the model circuits corresponding to the first and second netlists are synchronous circuits.

19. The method of claim 17, wherein the testing of the first and second netlists includes:
- synthesizing the first and second netlists in the test device to generate a synthesized circuit; and
- testing the synthesized circuit.

* * * * *